United States Patent [19]

Sisson

[11] Patent Number: 4,596,979

[45] Date of Patent: Jun. 24, 1986

[54] FAST RESPONSE DIGITAL-TO-ANALOG CONVERTER

[76] Inventor: Norwood Sisson, 7431 E. Portland St., Scottsdale, Ariz. 85257

[21] Appl. No.: 611,500

[22] Filed: May 17, 1984

[51] Int. Cl.[4] .............................................. H03M 1/00
[52] U.S. Cl. .............................................. 340/347 DA
[58] Field of Search ................................ 340/347 DA

[56] References Cited

U.S. PATENT DOCUMENTS

| | | | |
|---|---|---|---|
| 2,538,615 | 1/1951 | Carbrey | 340/347 DA |
| 2,632,058 | 3/1953 | Gray | 340/347 DA |
| 2,954,165 | 9/1960 | Myers | 340/347 DA |
| 2,986,727 | 5/1961 | Macklem | 340/347 DA |

OTHER PUBLICATIONS

R. H. Breedlove, Ladder Decoder, IBM Technical Disclosure Bulletin, vol. 3, No. 7, Dec. 1960, p. 17.
Walter G. Jung, IC Converter Cookbook, 1978, p. 167.
David Hoeschele, Jr., Analog-to-Digital/-Digital-to-Analog Conversion Techniques, Aug. 1968, pp. 334–336.

*Primary Examiner*—William M. Shoop, Jr.
*Assistant Examiner*—Sharon D. Logan

[57] ABSTRACT

A digital-to-analog converter for high speed applications including slew rate limited waveform generation such as raster scanning is described. The converter includes a binary current ladder for providing a plurality of weighted current values, a plurality of electronic switches, preferably "n"-channel field effect transistors, for directing the current from the binary current ladder to the appropriate output terminals and a gray code controller for controlling the operation of the switches.

9 Claims, 5 Drawing Figures

FAST RESPONSE DIGITAL-TO-ANALOG CONVERTER

BACKGROUND OF THE INVENTION

1. Field of the Invention

This invention relates generally to digital-to-analog converters, and more particularly, to digital-to-analog converters having a rapid response time.

2. Description of the Related Art

It is known in the related art to provide a plurality of predetermined switchable current or voltage sources along with a summing network. A digital input is decoded to activate appropriate switching. The summing network combines the activated current or voltage sources to provide an analog output representation of a digital input signal.

While all digital-to-analog converters utilize this technique, the converters of the related art are generally relatively slow because successive segments of a reconstructed signal can require a multiplicity of switch changes even for changes on the least significant incremental bit. Some techniques to overcome the disadvantages of the slow speed of the system have involved using higher speed technologies.

SUMMARY OF THE INVENTION

It is therefore an object of the present invention to provide an improved digital-to-analog converter.

It is a more particular object of the present invention to provide a digital-to-analog converter responsive to a gray code wherein only one switching stage changes state for each incremental change in the binary signal.

The aforementioned and other objects are accomplished according to the present invention by coupling a plurality of current sources into an analog signal representation of a digital input signal. A plurality of switches or stages are coupled to the current sources, and a gray code controller is provided for controlling the (open or closed) state of the switches or stages. The switches are arranged to respond to the gray code controller so that only one switching stage is changed for each incremental change of the analog signal. Because only one switch stage change is required for each incremental change in the digital signal, this eliminates skewing effects. A plurality of field effect transistors comprise each switching stage in the preferred embodiment and in particular n-channel MOSFET devices are used in the preferred embodiment.

These and other features of the present invention will be more fully understood upon reading of the following description along with the drawings which are briefly described hereinbelow.

DESCRIPTION OF THE PREFERRED EMBODIMENT

Detailed Description of the Drawings

Figure 1:
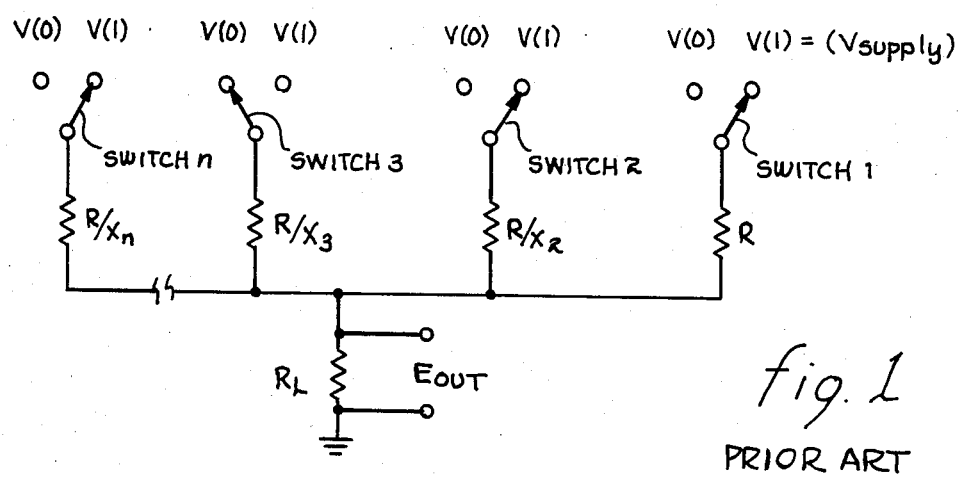
FIG. 1 is a generalized schematic diagram illustrating a prior art technique for digital-to-analog conversion.

Referring to FIG. 1, resistor $R_L$ has a first terminal coupled to the ground potential. The supply voltage $V_{supply}$ is coupled through switch 1 in series with resistor R to a second terminal of $R_L$, is coupled through switch 2 in series with resistor $R/X_2$ to the second terminal of resistor $R_L$, is coupled through switch 3 in series with resistor $R/X_3$ to the second terminal of resistor $R_L$, and is coupled through switch n in series with resistor $R/X_n$ to the second terminal of resistor $R_L$.

Figure 2A:
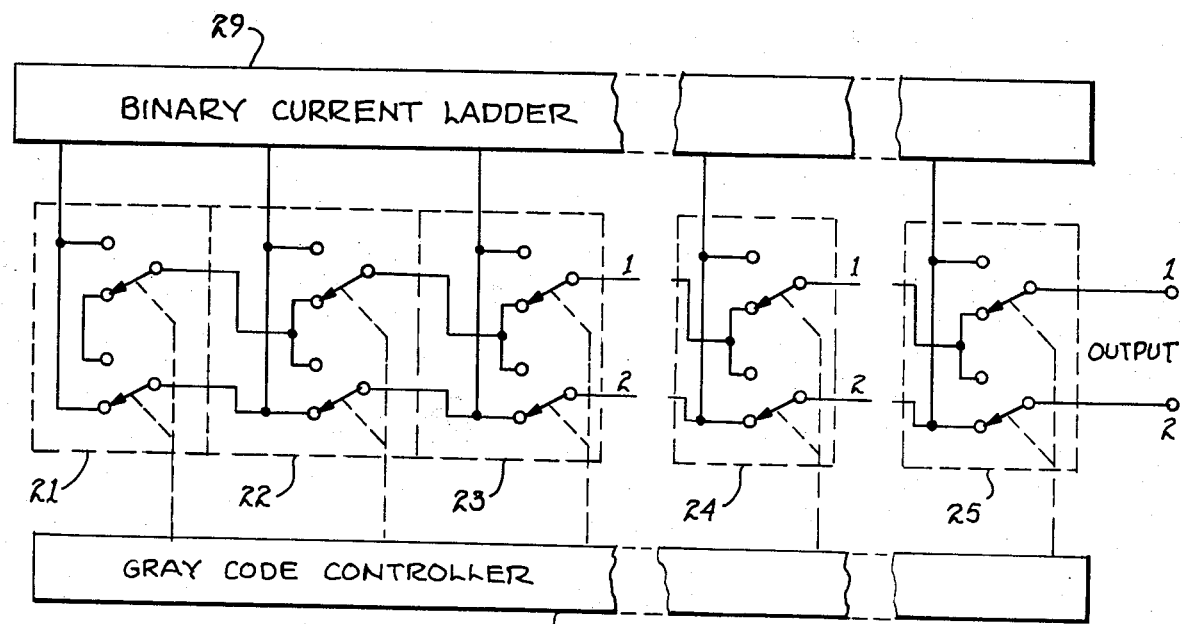
FIG. 2A is a part block-part schematic diagram which includes mechanical switches illustrating the operation of the digital-to-analog converter of the instant invention.

Referring to FIG. 2A, a plurality of switches 21, 22, 23, 24, 25 are coupled to a plurality of current sources from binary current ladder 29 and to a plurality of state control signals from gray code controller 28.

Figure 2B:
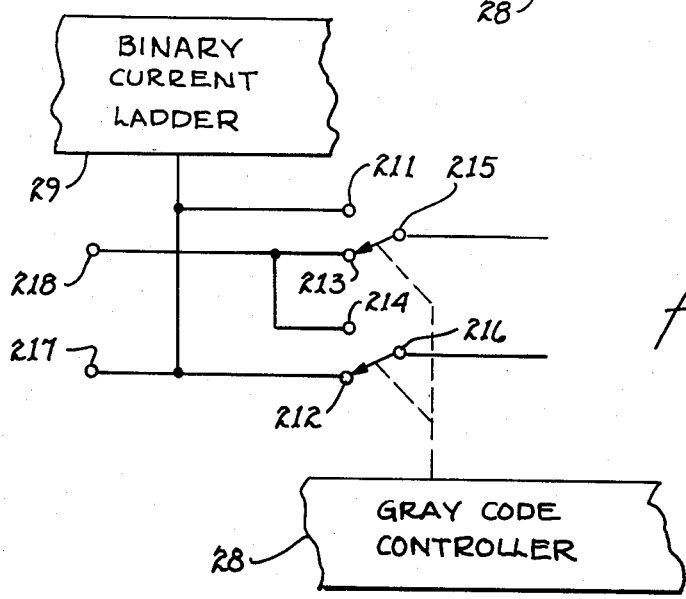
FIG. 2B is a part block-part schematic diagram of one of the switching stages used in implementing the instant invention.

Referring to FIG. 2B, a detailed schematic diagram representative of any of the switches 21, 22, 23, 24 and 25 is shown. Terminals 211 and 212 are directly coupled together and form a first input terminal. The first input of each stage is coupled to a current source terminal from binary current ladder 29 and coupled (except for the first stage) to a second output terminal 217 of the preceding stage. Terminals 213 and 214 are coupled together to form a second input terminal. The second input terminal is coupled to first output terminal 218 of the preceeding stage (except for the first stage). Terminal 215 is a first output terminal of the stage (21, 22, 23, 24 or 25) while terminal 216 is a second output terminal of the stage. Terminal 216 and terminal 212 are coupled together by a first switch and terminals 215 and 213 are coupled together by a second switch when the associated output of the gray code controller 28 has or is in a first state. Terminal 216 and terminal 214 are coupled together by the first switch and terminal 215 and terminal 211 are coupled together by the second switch when the associated output of the gray code controller 28 is in a second state for changing the position of the switches.

Figure 3A:
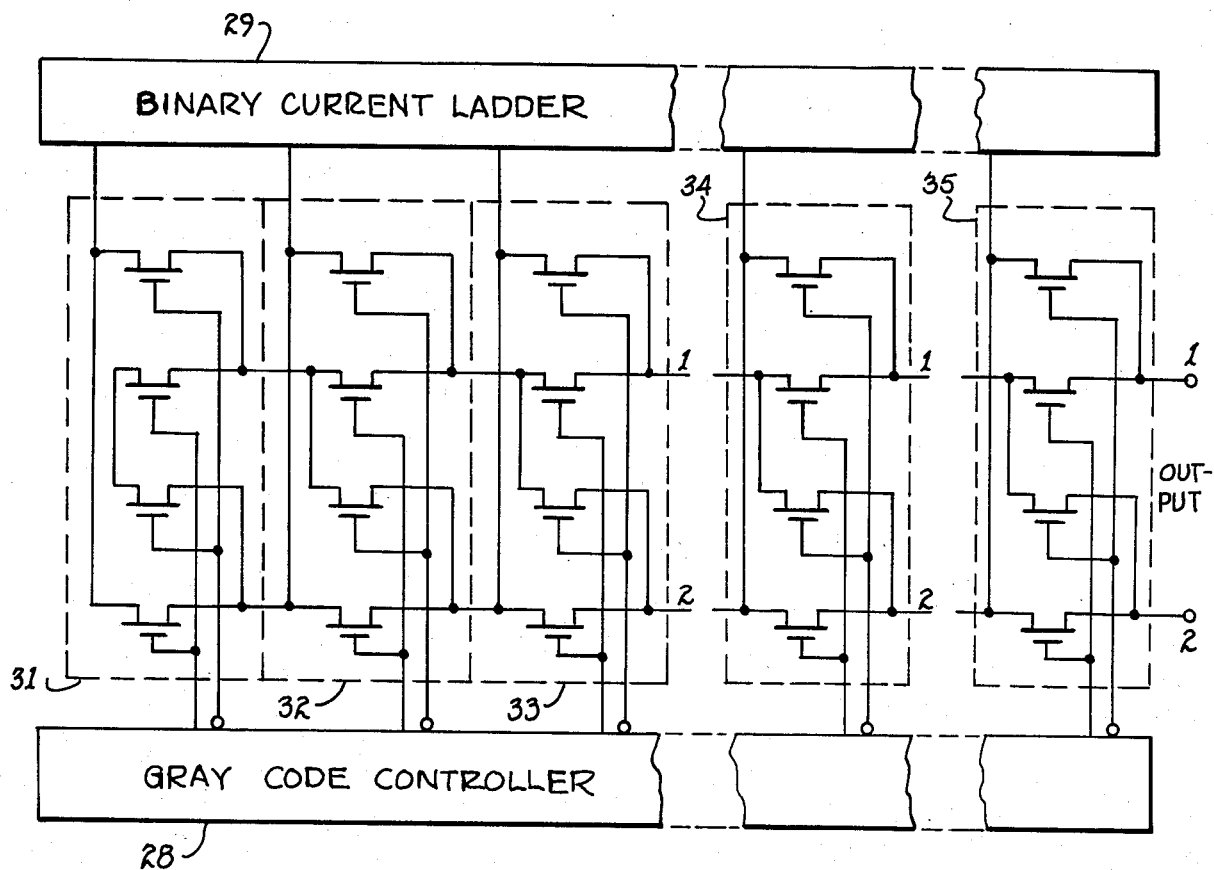
FIG. 3A is a diagram (similar to FIG. 2A) of a digital-to-analog converter according to the present invention.

Referring to FIG. 3A, the switching arrangement of FIG. 2A is implemented using field effect transistors. A plurality of electronic (switching) stages 31, 32, 33, 34 and 35 receive current source signals from current sources in binary current ladder 29. The state of the four SET switches in each of the stages 31, 32, 33, 34 or 35 is determined by the state of the associated control terminals of the gray code controller.

Figure 3B:
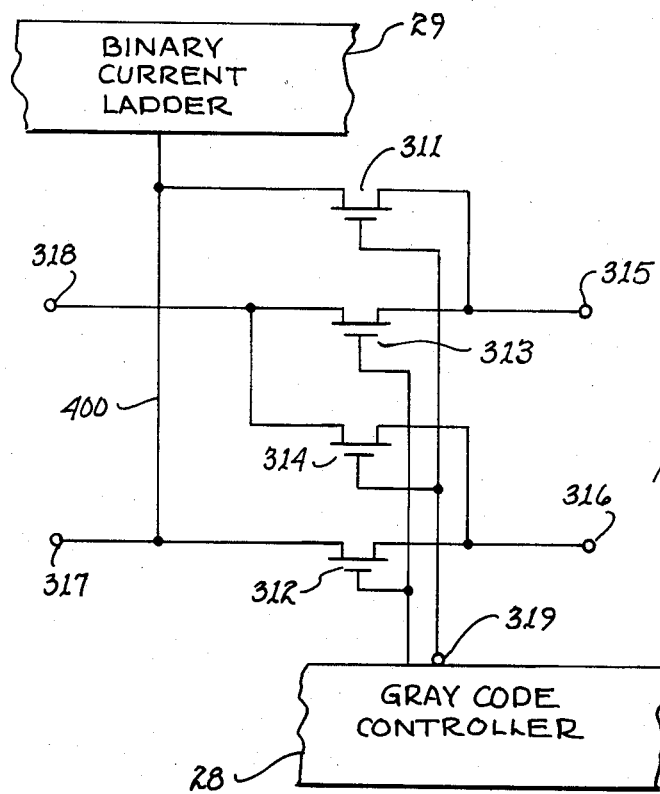
FIG. 3B is a diagram (similar to FIG. 3A) of the implementation of one of the switching stages of the preferred embodiment of the present invention utilizing field effect transistors.

Referring to FIG. 3B, a schematic diagram of the electronic switching arrangement is shown. Terminals 315, 316, 317 and 318 of FIG. 3B correspond to terminals 215, 216, 217 and 218 of FIG. 2A. Preferably N-channel MOSFET devices 311, 312, 313 and 314 of FIG. 3B correspond to the switches in FIG. 2B associated with the terminals 211, 212, 213 and 214. A first input terminal is comprised of the source terminals of devices 311 and 312 electrically coupled together by means of electrical conductor 400. The first input of each stage is coupled to a current source from the binary current ladder 29 and coupled (except for the first stage) to a second output terminal of the preceeding electronic switching stage. A second input terminal 318 is comprised of the coupled source terminals of the devices 313 and 314. The second input terminal 318 is coupled to a first output terminal of the preceeding electronic switching stage (except for the first stage 31).

Terminal 315 is a first output terminal of the switching stage (shown in FIG. 3B) and is coupled to drain terminals of the devices 311 and 313. Terminal 316 is a second output terminal and is coupled to drain terminals of the devices 312 and 314. The gate terminals of the devices 312 and 313 are coupled to the associated non-inverting output terminal of the gray code controller 28. Gate terminals of the devices 311 and 314 are coupled to the associated inverting output terminal 319 of the gray code controller 28.

Operation of the Preferred Embodiment

Referring once again to FIG. 1, a general concept behind the technique of digital to analog conversion is illustrated. In that Figure, $R > R/X_2 > R/X_3 \ldots > R/X_n$. One of the binary signals $V_{(0)}$ or $V_{(1)}$ (which is $V_{supply}$) will be applied to the resistors and the output voltage is determined by the resistance dividing network resulting from the selection of switch states. With appropriate choices of the resistance in R, $R/X_2, \ldots R/X_n$, a voltage value can be produced with accuracy, as known in the prior art.

Referring to FIG. 2A, the binary current ladder 29 applies a binary weighted sequence of current values to an associated sequence of switching stages. The gray code controller determines the state of the individual stages. The gray code, as known in the art, has the distinguishing feature that each successive increment of the digital signal is accomplished by a change of only one binary bit position. Thus, to increment or decrement the output voltage by the minimum interval, only one output signal of the gray code controller changes and consequently only one switching stage change is necessary.

Referring to FIG. 3A, the implementation of the switch of FIG. 2A with field effect transistor devices is shown. The signals from the gray code controller are used to control the gate portions of the SET devices. The output of the digital-to-analog converters will have smooth transitions because of the circuit arrangement shown in FIGS. 2A and 3A.

Some additional advantages of the subject invention are as follows:

1. Because of the low gate bias currents needed by the MOSFET devices of FIGS. 3A and 3B, it is easier to design a D-to-A converter which has an analog output that is not affected by bias currents.
2. Since the bias currents are balanced, the bias current at each input and output is the same for any gray code controller state thereby resulting in a constant offset.
3. Capacitive coupling from the gate terminals to the input and output terminals is balanced so that any transients on the input and output terminals caused by any transitions on the non-inverting and inverting outputs of the gray code controller are cancelled.
4. Each stage of the MOSFET embodiment of FIGS. 3A and 3B is a pair of different amplifiers. Thus, if a noninverting output and the inverting output of the gray code controller have a delay between transitions, the analog output current does not make a large transition as it would in an idealized mechanical switching arrangement. A smoother transition is achieved with the MOSFET embodiment of FIGS. 3A and 3B.
5. With a proper output termination for the last switching stage, the disclosed D-to-A D/A converter circuit may be used in a natural differential output configuration of single-ended output mode.
6. With a number of current ladder implementations, a variable input signal that is supplied to the current ladder allows the D-to-A converter to be used as a multiplying D-to-A converter.
7. The disclosed D-to-A converter may be in series or parallel with other signals to either introduce or correct distortions. For example, the disclosed D-to-A converter may be used as a corrected drive for magnetic deflections charged particle beam devices such as cathode ray tubes and electron beam resist exposure systems. Also, the disclosed D-to-A converter can be used in deflection circuits where anode voltage and deflection sensitivity changes such as penetration beam cathode ray tubes.
8. The disclosed D-to-A converter may also be used in deflection circuits where the raster density is not constant over the area of the screen. For example, electronic systems may be used to track a person's eye movement in order to present a higher resolution image to the eye's fovea.

It should also be noted that the two intermediate terminals of the first stage 21 of FIG. 2a and the two intermediate MOSFETS of the first stage 31 of FIG. 3a are not necessary for switching the output currents, but are including to balance the switching transients.

The above description is included to illustrate the operation of the preferred embodiment and is not meant to limit the scope of the invention. The scope of the invention is to be limited only by the following claims. From the above description, many variations would be apparent to one skilled in the art that would yet be encompassed by the spirit and scope of the invention. For example, while current sources are described or used, current sinks can also be used.

What is claimed:

1. A digital-to-analog converter comprising:
  a plurality of current sources in sequence;
  a plurality of switching stage means each of which is operatively coupled to a different and distinct one of said plurality of current sources, each of said switching stage means having a first and second input terminal, one of said plurality of current sources being operatively coupled to said second input terminal, said switching stage means having a first and a second output terminal, said first output terminal of said switching stage means being operatively coupled to said first input terminal when said switching stage means is in a first stage, said second output terminal of said switching state means being operatively coupled to said second input terminal when said switching state means is in said first state; said switching state means connecting said first output terminal to said second input terminal and said second output terminal to said first input terminal when said switching stage means is in a second state; and
  a Gray code controller having a plurality of output signals coupled to each of said switching stage means for controlling the state of said switching stage means such that only one of said switching stages is changed for each incremental change in the digital signal for substantially eliminating skewing errors.

2. The digital-to-analog converter of claim 1 wherein said switching stage means is comprised of a plurality of field effect transistor means.

3. The digital-to-analog converter of claim 2 wherein said field effect transistor means are nchannel MOS devices for substantially eliminating the effects of biasing current in the analog output signal.

4. The digital-to-analog converter of claim 3 wherein the n-MOS field effect transistor means functions to (1) balance the bias current at each input and output of the stage to provide a constant offset; (2) provide capacitive coupling from the gate terminals to the input and output terminals for cancelling transients; and (3) to provide a smoother transition in the analog output signal.

5. The digital-to-analog converter of claim 1 wherein said plurality of current sources includes a current ladder circuit and means for supplying a variable input signal to the current ladder circuit to enable said digital-to-analog converter to be functional as a multiplying digital-to-analog converter.

6. The digital-to-analog converter of claim 1 wherein said plurality of current sources, said switching stage means, and said Gray code controller may be operatively coupled with sources of external signals to correct distortions therein.

7. The digital-to-analog converter of claim 1 wherein each of said switching stage means includes a pair of differential amplifier means for providing a smoother transmission in the analog output signal even if said Gray code controller has a delay between transitions.

8. A digital-to-analog converter comprising:
a plurality of current sources in sequence;
at least first and second switching stage means coupled to each one of said plurality of current sources, each of said switching stage means having a first and second input terminal, one of said plurality of current sources coupled to said second input terminal, each of said switching stage means having a first and a second output terminal, said first output terminal at said switching stage means coupled to said first input terminal when said switching stage means is in a first state, said second output terminal of said switching stage means coupled to said second input terminal when said switching stage means is in said first state; said switching state means connecting said first output terminal to said second input terminal and said second output terminal to said first input terminal when said switching stage means is in a second state;
a Gray code controller having a plurality of output signals coupled to each of said switching stage means for controlling the state of said switching stage means; and
said first output terminal of one of said at least first and second switching stage means being coupled to the first input terminal of the other of said at least first and second switching stage means and said second output terminal of said one switching stage means being coupled to the second input terminal of said second switching stage means.

9. A digital-to-analog converter comprising:
a plurality of current sources in sequence;
switching stage means including a plurality of switching stages coupled to each one of said plurality of current sources, said switching stage means having a first and second input terminal, one of said plurality of current sources coupled to said second input terminal, said switching stage means having a first and a second output terminal, said first output terminal at said switching stage means coupled to said first input terminal when said switching stage means is in a first state, said second output terminal of said switching stage means coupled to said second input terminal when said switching stage means is in said first state; said switching state means connecting said first output terminal to said second input terminal and said second output terminal to said first input terminal when said switching stage means is in a second state;
a Gray code controller having a plurality of output signals coupled to each of said switching stage means for controlling the state of said switching stage means; and
each of said switching stages includes a plurality of field effect transistors and each of said switching stages includes:
a first and second field effect transistor each having source terminals coupled to said second input terminal;
a third and fourth field effect transistor each having source terminals coupled to said first input terminal;
the drain terminals of said first and third field effect transistors being coupled to said first output terminal;
the drain terminals of said first and third field effect transistors being coupled to said first output terminal
the drain terminals of said second and fourth field effect transistors being coupled to said second output terminal;
the gate terminals of said second and third field effect transistors being coupled to a non-inverting output of said Gray code controller; and
the gate terminals of said first and fourth field effect transistors being coupled to an inverting output of said Gray code controller.

* * * * *